United States Patent
Cho

(10) Patent No.: US 8,581,641 B2
(45) Date of Patent: *Nov. 12, 2013

(54) POWER-UP SIGNAL GENERATION CIRCUIT

(71) Applicant: SK hynix Inc., Icheon-si (KR)

(72) Inventor: Yong Deok Cho, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/750,245

(22) Filed: Jan. 25, 2013

(65) Prior Publication Data

US 2013/0141144 A1 Jun. 6, 2013

Related U.S. Application Data

(63) Continuation of application No. 13/191,548, filed on Jul. 27, 2011, now Pat. No. 8,384,446.

(30) Foreign Application Priority Data

Apr. 11, 2011 (KR) .................. 10-2011-0033422

(51) Int. Cl.
*H03L 7/00* (2006.01)

(52) U.S. Cl.
USPC ................ 327/143; 327/72; 327/77; 327/198

(58) Field of Classification Search
USPC .................. 327/72, 74, 76, 77, 142, 143, 198
See application file for complete search history.

(56) References Cited

U.S. PATENT DOCUMENTS

| 8,384,446 B2 * | 2/2013 | Cho ............................. 327/143 |
| 2008/0106966 A1 * | 5/2008 | Park et al. ..................... 327/143 |

FOREIGN PATENT DOCUMENTS

| KR | 1020040093804 A | 9/2004 |
| KR | 1020110023115 A | 3/2011 |

\* cited by examiner

*Primary Examiner* — Long Nguyen
(74) *Attorney, Agent, or Firm* — William Park & Associates Patent Ltd.

(57) ABSTRACT

A power-up signal generation circuit includes: a first section signal generation unit configured to sense a level of an external voltage and a level of an internal voltage and generate a first section signal; a second section signal generation unit configured to output a second section signal by buffering the first section signal when the internal voltage is lowered to below a minimum level; and a selective output unit configured to output the first section signal as a power-up signal, wherein the selective output unit outputs the second section signal as the power-up signal when a power-up section is ended and a mode register setting operation is performed.

16 Claims, 5 Drawing Sheets

POWER-UP SIGNAL GENERATION CIRCUIT

CROSS-REFERENCES TO RELATED APPLICATIONS

The present application claims priority under 35 U.S.C. 119(a) to Korean Application No. 10-2011-0033422, filed on Apr. 11, 2011, in the Korean intellectual property Office, which is incorporated herein by reference in its entirety.

BACKGROUND

In general, a power-up signal generation circuit serves to reset a semiconductor memory device. A semiconductor memory device operates with an external voltage (VEXT). The external voltage (VEXT) rises from 0 V up to a preset level at a constant slope. At this time, if the internal circuits of the semiconductor memory device are directly supplied with the external voltage (VEXT), they may be adversely affected by the rising external voltage (VEXT) to cause malfunction. To prevent the malfunction, the semiconductor memory device includes a power-up signal generation circuit that generates a power-up signal whose level is changed when a power-up period during which an external voltage (VEXT) rises up to a preset level ends.

Meanwhile, a semiconductor memory device, receiving the external voltage (VEXT), generates various internal voltages, such as a core voltage (VCORE), a peripheral voltage (VPERI), and a bitline precharge voltage (VBLP). The internal voltages used in the semiconductor memory device are designed to maintain preset levels, and the semiconductor memory device may malfunction if the levels of the internal voltages become lower than the preset levels.

Therefore, a known power-up signal generation circuit generates a power-up signal when an internal voltage as well as an external voltage reaches a preset level. For example, if the internal voltage reaches the preset level, the power-up signal generation circuit generates the power-up signal and the semiconductor memory device becomes reset in response to the power-up signal. Further, after the power up process described above is finished, the internal voltage maintains a voltage level higher than the preset level.

However, if a semiconductor memory device performs a high-current-consuming operation, such as a bank active operation or a self-refresh operation, a level of the internal voltage may be lowered to below the preset level, and thus causing the semiconductor memory device to be reset. Specifically, as illustrated in FIG. 1, if an internal voltage VINT is lowered to below the preset level, e.g., a power-up level (1.1 V to 1.2 V), a power-up signal PWRUP may be again enabled to a logic high level to reset the semiconductor memory device, as indicated by "X".

Meanwhile, even though the internal voltage is lowered to below the power-up level (1.1 V to 1.2 V), the semiconductor memory device may normally operate. However, the known power-up signal generation circuit always resets the semiconductor memory device if the internal voltage is lowered to below the power-up level (1.1 V to 1.2 V).

SUMMARY

An embodiment of the present invention is directed to a power-up signal generation circuit which is capable of stably resetting a semiconductor memory device according to a level of an internal voltage.

In one embodiment, a power-up signal generation circuit includes: a first section signal generation unit configured to sense a level of an external voltage and a level of an internal voltage and generate a first section signal; a second section signal generation unit configured to output a second section signal by buffering the first section signal when the internal voltage is lowered to below a minimum level; and a selective output unit configured to output the first section signal as a power-up signal, wherein the selective output unit outputs the second section signal as the power-up signal when a power-up section is ended and a mode register setting operation is performed.

In another embodiment, a power-up signal generation circuit includes: a select signal generation unit configured to generate a select signal that is driven to a first level during a power-up period and is driven to a second level during a mode register setting operation; and a selective output unit configured to receive a first section signal, whose level is changed according to levels of an external voltage and an internal voltage, and a second section signal, which is generated by buffering the first section signal when the internal voltage is lowered to below a minimum level, and output the first section signal or the second section signal as a power-up signal in response to the select signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
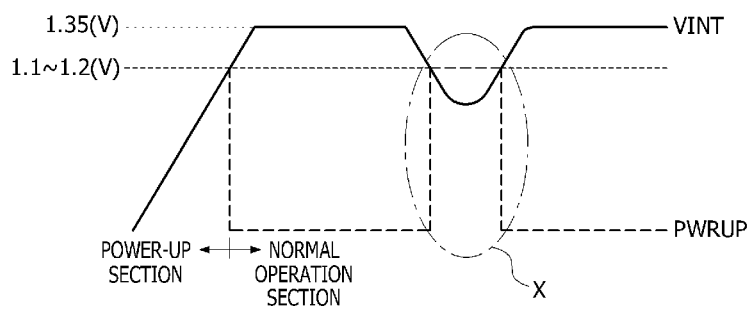
FIG. 1 is a view explaining the operation of a conventional power-up signal generation circuit.
Figure 2:
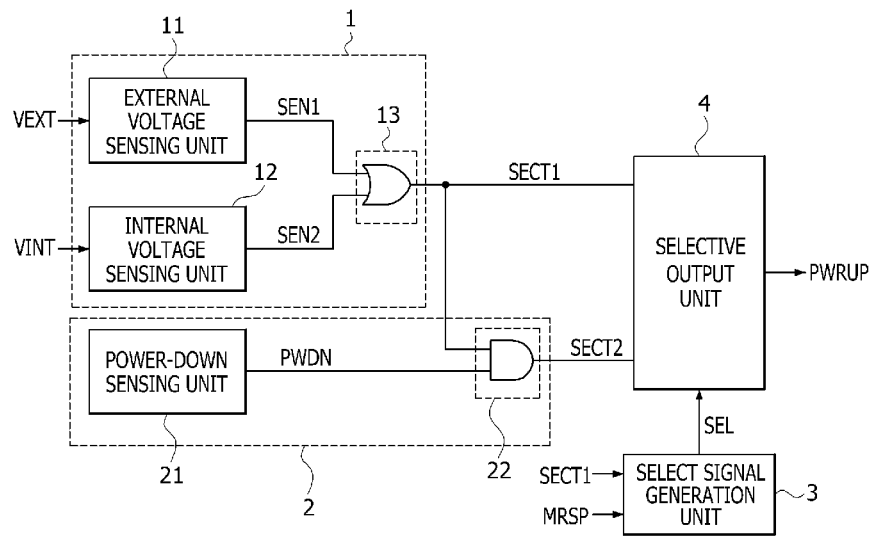
FIG. 2 is a block diagram illustrating the configuration of a power-up signal generation circuit according to an embodiment of the present invention.

FIG. 2 is a block diagram illustrating the configuration of a power-up signal generation circuit according to an embodiment of the present invention.

Referring to FIG. 2, the power-up signal generation circuit according to the embodiment of the present invention includes a first section signal generation unit 1, a second section signal generation unit 2, a select signal generation unit 3, and a selective output unit 4. The first section signal generation unit 1 is configured to sense a level of an external signal VEXT and a level of an internal voltage VINT and generate a first section signal SECT1. The second section signal generation unit 2 is configured to generate a second section signal SECT2 by buffering the first section signal SECT1 when the internal voltage VINT is lowered to below a minimum level. The select signal generation unit 3 is configured to generate a select signal SEL that is driven to a logic low level during a power-up section and is driven to a logic high level during a mode register setting operation. The selective output unit 4 is configured to output the first section signal SECT1 as a power-up signal PWRUP when the select signal SEL is at a logic low level and output the second section signal SECT2 as the power-up signal PWRUP when the select signal SEL is at a logic high level.

The first section signal generation unit 1 includes an external voltage sensing unit 11, an internal voltage sensing unit 12, and a logic unit 13. The external voltage sensing unit 11 is configured to generate a first sense signal SEN1 whose level is changed from a logic high level to a logic low level when the external voltage VEXT rises to above a first target level. The internal voltage sensing unit 12 is configured to generate a second sense signal SEN2 whose level is changed from a logic high level to a logic low level when the internal voltage VINT rises to above a second target level. The logic unit 13 is configured to generate the first section signal SECT1 of a logic low level when the levels of both of the first sense signal SEN1 and the second sense signal SEN2 are changed to a logic low level. The first target level and the second target level may be variously set according to embodiments.

The second section signal generation unit 2 includes a power-down sensing unit 21 and a buffer unit 22. The power-down sensing unit 21 is configured to generate a power-down signal PWDN that is enabled to a logic high level when the internal voltage VINT is below a minimum level. The buffer unit 22 is configured to output the second section signal SECT2 by buffering the first section signal SECT1 when the power-down signal PWDN is enabled to a logic high level. The minimum level may be variously set according to embodiments, and it is suitable that the minimum level is set to be below the power-up level, that is, the level of the external voltage VEXT or the internal voltage VINT at which the level of the power-up signal PWRUP is changed, e.g. from a logic low level to a logic high level, in the power-up period.

Figure 3:
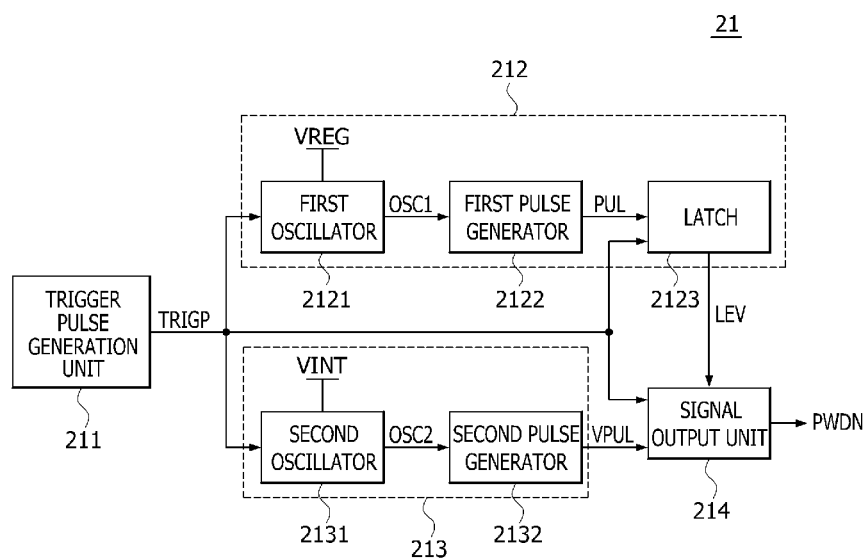
FIG. 3 is a block diagram illustrating the configuration of a power-down sensing unit included in the power-up signal generation circuit of FIG. 2.

Referring to FIG. 3, the power-down sensing unit 21 includes a trigger pulse generation unit 211, a level signal generation unit 212, a variable pulse signal generation unit 213, and a signal output unit 214. The trigger pulse generation unit 211 is configured to output a trigger pulse TRIGP during a high-current-consuming operation, such as a bank active operation or a self-refresh operation. The level signal generation unit 212 is configured to generate a level signal LEV that is enabled at a preset first point of time when the trigger pulse TRIGP is inputted. The variable pulse signal generation unit 213 is configured to generate a variable pulse signal VPUL, which includes a pulse generated at a second point of time which is variable according to the level of the internal voltage VINT, when the trigger pulse TRIGP is inputted. The signal output unit 214 is configured to generate the power-down signal PWDN that is enabled when the pulse of the variable pulse signal VPUL is inputted while the level signal LEV is in an enabled state. The second point of time is earlier than the first point of time when the internal voltage VINT is in the range between the power-up level and the minimum level. Meanwhile, the second point of time is later than the first point of time when the internal voltage VINT is below the minimum level.

The level signal generation unit 212 includes a first oscillator 2121, a first pulse generator 2122, and a latch 2123. The first oscillator 2121 is driven when the trigger pulse TRIGP is inputted, and receives a fixed voltage VREG having a fixed level to generate a first oscillation signal OSC1 having a constant period. The first pulse generator 2122 is configured to generate the pulse signal PUL including a pulse that is generated in synchronization with a rising edge of the first oscillation signal OSC1. The latch 2123 is configured to latch the pulse signal PUL and output the level signal LEV when the trigger pulse TRIGP is inputted.

The variable pulse signal generation unit 213 includes a second oscillator 2131 and a second pulse generator 2132. The second oscillator 2131 is driven when the trigger pulse TRIGP is inputted, and receives the internal voltage VINT and generates a second oscillation signal OSC2 having a variable period according to the level of the internal voltage VINT. The second pulse generator 2132 is configured to generate the variable pulse signal VPUL including a pulse that is generated in synchronization with a rising edge of the second oscillation signal OSC2.

Figure 4:
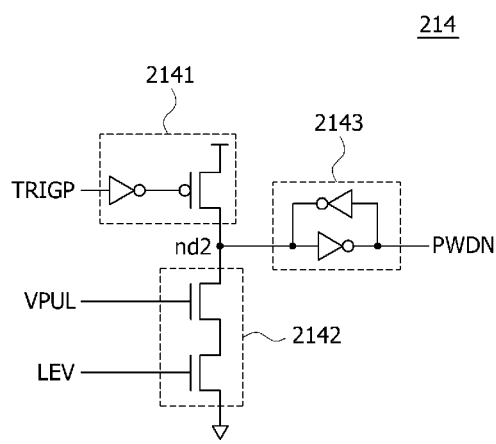
FIG. 4 is a circuit diagram illustrating a signal output unit included in the power-down sensing unit of FIG. 3.

Referring to FIG. 4, the signal output unit 214 includes a pull-up driver 2141, a pull-down driver 2142, and a latch 2143. The pull-up driver 2141 is configured to pull-up drive a node nd2 when the trigger pulse TRIGP is inputted. The pull-down driver 2142 is configured to pull-down drive the node nd2 when the pulse of the variable pulse signal VPUL is inputted while the level signal LEV is in an enabled state of a logic high level. The latch 2143 is configured to latch a signal of the node nd2 and output the power-down signal PWDN.

Figure 5:
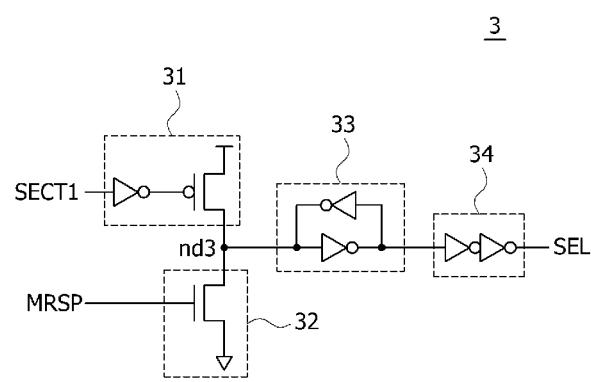
FIG. 5 is a circuit diagram illustrating a select signal generation unit included in the power-up signal generation circuit of FIG. 2.

Referring to FIG. 5, the select signal generation unit 3 includes a pull-up driver 31, a pull-down driver 32, a latch 33, and a buffer 34. The pull-up driver 31 is configured to pull-up drive a node nd3 when the first section signal SECT1 of a logic high level is inputted during the power-up section. The pull-down driver 32 is configured to pull-down drive the node nd3 when a mode register signal MRSP is enabled to a logic high level. The latch 33 is configured to latch and output a signal of the node nd3. The buffer 34 is configured to output the select signal SEL by buffering the output signal of the latch 33. The mode register signal MRSP is a signal that is enabled to a logic high level in order for a mode register setting operation to set information such as burst length information and latency information of the semiconductor memory device and store the information such as the set burst length information and latency information in a mode register (not shown).

Figure 6:
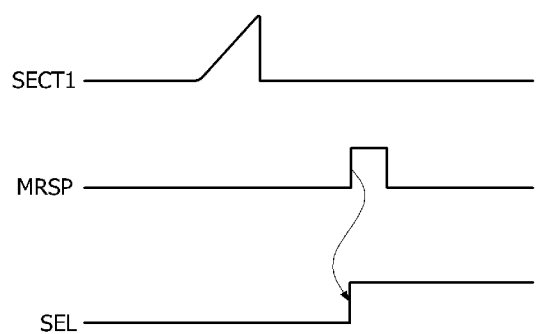
FIG. 6 is a view explaining the operation of the select signal generation unit of FIG. 5.

Referring to FIG. 6, the select signal generation unit 3 is configured to receive the first section signal SECT1 of a logic high level in the power-up section and generate the select signal SEL of a logic low level. In addition, the select signal generation unit 3 is configured to generate the select signal of a logic high level in response to the mode register signal MRSP that is enabled to a logic high level in order for the mode register setting operation.

The operation of the power-up signal generation circuit having the above-mentioned configuration will be described below, on the assumption that the power-up section is ended and the mode register setting operation is completed, and thus, the select signal SEL outputted from the select signal generation unit 3 has a logic high level.

Figure 7:
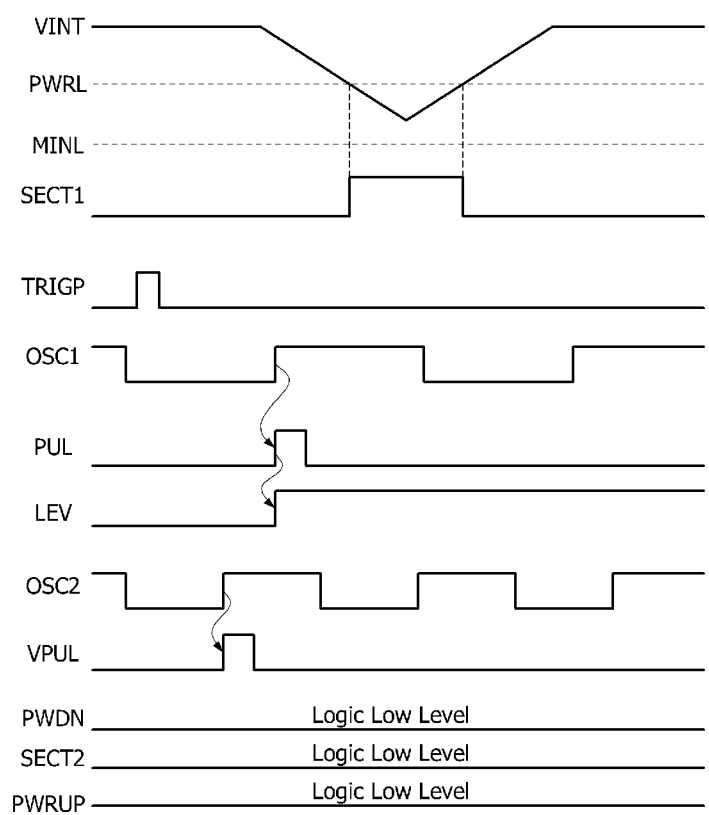
FIGS. 7 and 8 are views explaining the operation of the power-up signal generation circuit of FIG. 2.

Hereinafter, the operation of the power-up signal generation circuit in the case where the internal voltage VINT is changed to a level between the power-up level and the minimum level will be described with reference to FIG. 7.

If the internal voltage VINT is lowered to a level between the power-up level and the minimum level, the first section signal SECT1 is generated with a logic high level in a period during which the internal voltage VINT is below the power-up level.

Meanwhile, in response to the trigger pulse TRIGP generated by the high-current-consuming operation such as the bank active operation or the self-refresh operation, the level signal generation unit 212 generates the level signal LEV whose level is changed from a logic low level to a logic high level at the preset first point of time, and the variable pulse signal generation unit 213 generates the variable pulse signal VPUL, which includes the pulse generated at the second point of time which is variable according to the level of the internal voltage VINT. Since the second point of time is earlier than the first point of time when the internal voltage VINT is in the range between the power-up level and the minimum level, the pulse of the variable pulse signal VPUL is generated before the level signal LEV is enabled to a logic high level.

Since the power-down signal PWDN outputted from the signal output unit 214 is maintained in a disabled state of a logic low level, the second section signal SECT2 outputted from the buffer unit 22 and the power-up signal PWRUP outputted from the selective output unit 4 are all maintained at a logic low level.

As described above, when the internal voltage VINT is lowered to a level between the power-up level and the minimum level, the power-up signal generation circuit according to the embodiment of the present invention generates the power-up signal PWRUP maintained in the disabled state of the logic low level, thereby preventing the semiconductor memory device from being reset.

Figure 8:
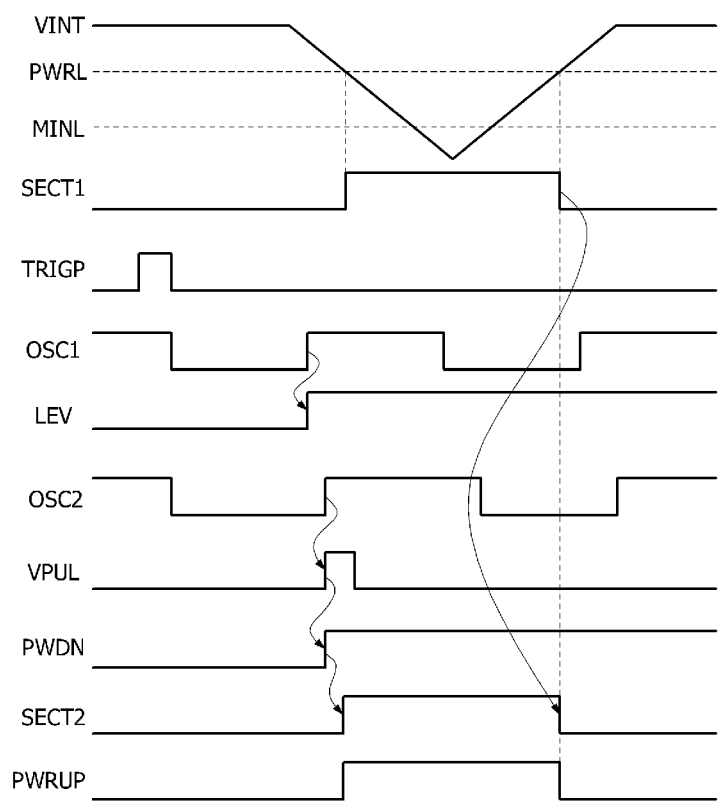

Hereinafter, the operation of the power-up signal generation circuit in the case where the internal voltage VINT is changed to below the minimum level will be described with reference to FIG. 8.

If the internal voltage VINT is changed to below the minimum level, the first section signal SECT1 is generated with a logic high level in a period during which the internal voltage VINT is below the power-up level.

Meanwhile, in response to the trigger pulse TRIGP generated by the high-current-consuming operation such as the bank active operation or the self-refresh operation, the level signal generation unit 212 generates the level signal LEV whose level is changed from a logic low level to a logic high level at the preset first point of time, and the variable pulse signal generation unit 213 generates the variable pulse signal VPUL, which includes the pulse generated at the second point of time which is variable according to the level of the internal voltage VINT. Since the second point of time is later than the first point of time when the internal voltage VINT is changed to below the minimum level, the pulse of the variable pulse signal VPUL is generated after the level signal LEV is enabled to a logic high level.

Since the power-down signal PWDN outputted from the signal output unit 214 is enabled to a logic high level, the second section signal SECT2 outputted from the buffer unit 22 and the power-up signal PWRUP outputted from the selective output unit 4 are all enabled to logic high level.

As described above, when the internal voltage VINT is lowered to below the minimum level, the power-up signal generation circuit according to the embodiment of the present invention enables the power-up signal PWRUP to a logic high level to cause the semiconductor memory device to be reset. If the internal voltage VINT is lowered to below the minimum level, it may not operate normally and therefore it needs to be reset.

In summary, according to the embodiment of the present invention, the power-up signal generation circuit prevents the semiconductor memory device from being reset when the internal voltage VINT is lowered to a level between the power-up level and the minimum level, and the power-up signal generation circuit resets the semiconductor memory device when the internal voltage VINT is changed to below the minimum level, thereby ensuring the stable reset operation of the semiconductor memory device.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A power-up signal generation circuit comprising:
   a second section signal generation unit configured to output a second section signal by buffering a first section signal when an internal voltage is lowered to below a minimum level; and
   a selective output unit configured to output the first section signal and the second section signal as a power-up signal, wherein the selective output unit outputs the first section signal as the power-up signal during a power-up section and wherein the selective output unit outputs the second section signal as the power-up signal when the power-up section is ended and a mode register setting operation is performed.

2. The power-up signal generation circuit of claim 1, wherein the first section signal whose level is changed when the external voltage is above a first target level and the internal voltage is above a second target level.

3. The power-up signal generation circuit of claim 2, further comprises:
   an external voltage sensing unit configured to generate a first sense signal whose level is changed when the external voltage rises to above the first target level;
   an internal voltage sensing unit configured to generate a second sense signal whose level is changed when the internal voltage rises to above the second target level; and
   a logic unit configured to generate the first section signal whose level is changed when the levels of both of the first sense signal and the second sense signal are changed.

4. The power-up signal generation circuit of claim 1, wherein the second section signal generation unit comprises:
   a power-down sensing unit configured to generate a power-down signal that is enabled when the internal voltage is below the minimum level; and
   a buffer unit configured to generate the second section signal by buffering the first section signal in response to the power-down signal.

5. The power-up signal generation circuit of claim 4, wherein the power-down sensing unit comprises:
   a level signal generation unit configured to generate a level signal that is enabled at a first point of time when a trigger pulse is inputted;
   a variable pulse signal generation unit configured to generate a variable pulse signal, which includes a pulse generated at a second point of time, when the trigger pulse is inputted; and
   a signal output unit configured to generate the power-down signal that is enabled when the pulse of the variable pulse signal is inputted while the level signal is in an enabled state.

6. The power-up signal generation circuit of claim 5, wherein the second point of time is earlier than the first point of time when the internal voltage is above the minimum level, and the second point of time is later than the first point of time when the internal voltage is below the minimum level.

7. The power-up signal generation circuit of claim 5, wherein the trigger pulse is inputted in a bank active operation or a self-refresh operation.

8. The power-up signal generation circuit of claim 5, wherein the level signal generation unit comprises:
   an oscillator driven in response to the trigger pulse to receive a fixed voltage having a fixed level and generate an oscillation signal having a constant period;
   a pulse generator configured to generate a pulse signal including a pulse that is generated in synchronization with the oscillation signal; and
   a latch configured to latch the pulse signal in response to the trigger pulse and generate the level signal.

9. The power-up signal generation circuit of claim 8, wherein the pulse generator generates the pulse signal including a pulse that is generated at a rising edge of the oscillation signal.

10. The power-up signal generation circuit of claim 8, wherein the latch generates the level signal that is enabled at a point of time when the pulse of the pulse signal is inputted.

11. The power-up signal generation circuit of claim 5, wherein the variable pulse signal generation unit comprises:
   an oscillator driven in response to the trigger pulse to receive the internal voltage and generate an oscillation signal having a variable period according to the level of the internal voltage; and
   a pulse generator configured to generate a variable pulse signal including a pulse that is generated in synchronization with the oscillation signal.

12. The power-up signal generation circuit of claim 11, wherein the oscillation signal has a period that increases as the level of the internal voltage is lowered.

13. The power-up signal generation circuit of claim 5, wherein the signal output unit outputs the power-down signal that is disabled when the trigger pulse is inputted.

14. The power-up signal generation circuit of claim 1, wherein the selective output unit receives a select signal, outputs the first section signal as the power-up signal when the select signal is at a first level, and outputs the second section signal as the power-up signal when the select signal is at a second level.

15. The power-up signal generation circuit of claim 14, further comprising a select signal generation unit configured to drive the select signal to the first level during the power-up section and drive the select signal to the second level during the mode register setting operation.

16. The power-up signal generation circuit of claim 15, wherein the select signal generation unit comprises:
   a pull-up driver configured to pull-up drive a node in response to the first section signal; and
   a pull-down driver configured to pull-down drive the node in response to a mode register signal that is enabled during the mode register setting operation.

* * * * *